United States Patent
Tada et al.

(10) Patent No.: US 9,727,196 B2
(45) Date of Patent: Aug. 8, 2017

(54) WIRING SUBSTRATE

(71) Applicant: FUJIFILM Corporation, Tokyo (JP)

(72) Inventors: Nobuyuki Tada, Kanagawa-ken (JP);
Yasushi Endo, Kanagawa-ken (JP);
Akihiro Hashimoto, Kanagawa-ken (JP); Tadashi Kuriki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/992,429

(22) Filed: Jan. 11, 2016

(65) Prior Publication Data
US 2016/0124550 A1    May 5, 2016

Related U.S. Application Data

(63) Continuation of application No. PCT/JP2014/068141, filed on Jul. 8, 2014.

(30) Foreign Application Priority Data

Jul. 12, 2013 (JP) ................................ 2013-146601

(51) Int. Cl.
*H01R 9/00* (2006.01)
*G06F 3/044* (2006.01)
(Continued)

(52) U.S. Cl.
CPC .............. *G06F 3/044* (2013.01); *G06F 3/041* (2013.01); *H05K 1/02* (2013.01); *H05K 1/0289* (2013.01);
(Continued)

(58) Field of Classification Search
CPC .............. G02F 1/1345; G02F 1/13452; G02F 1/136286; G06F 3/041; G06F 3/047; G06F 3/412; G06F 3/045
(Continued)

(56) References Cited

U.S. PATENT DOCUMENTS 4,868,705 A    9/1989 Shiochi et al.
5,371,687 A    12/1994 Holmes, II et al.
(Continued)

FOREIGN PATENT DOCUMENTS

| JP | 63-205928 | 8/1988 |
|---|---|---|
| JP | 6-198806 A | 8/1993 |
| JP | 6-216062 | 8/1993 |
| JP | 2005-353045 A | 12/2005 |
| JP | 2008-083899 A | 4/2008 |
| JP | 2008-270757 A | 11/2008 |
| JP | 2010-140041 A | 6/2010 |

(Continued)

OTHER PUBLICATIONS

International Search Report issued in PCT/JP2014/068141 mailed Sep. 2, 2014.
Written Opinon of PCT/JP2014/068141 mailed Sep. 2, 2014.

*Primary Examiner* — Binh Tran
(74) *Attorney, Agent, or Firm* — Studebaker & Brackett PC

(57) ABSTRACT

A wiring board includes a plurality of first terminal parts for electrically connecting with a control circuit and disposed corresponding to a plurality of first electrode parts, and first terminal wiring parts for electrically connecting the plurality of first electrode parts and the corresponding first terminal parts. Each of the first terminal wiring parts has, in at least a portion thereof falling in a circle with a radius of 10 mm centering around a boundary part between the first terminal wiring parts and the corresponding first terminal parts, a portion having a line width of 5 μm to 100 μm inclusive, the wiring resistance value of the first terminal wiring parts connected to the first terminal parts being 100 ohms to 10 kohms inclusive.

9 Claims, 12 Drawing Sheets

(51) Int. Cl.
*G06F 3/041* (2006.01)
*H05K 1/02* (2006.01)
*H05K 1/11* (2006.01)
*H05K 1/03* (2006.01)
*H05K 1/09* (2006.01)
*H05K 7/00* (2006.01)
*H05K 1/18* (2006.01)
*H05K 1/00* (2006.01)
*G06F 3/045* (2006.01)
*G02F 1/1345* (2006.01)
*G02F 1/1362* (2006.01)

(52) U.S. Cl.
CPC ............ *H05K 1/0298* (2013.01); *H05K 1/03* (2013.01); *H05K 1/09* (2013.01); *H05K 1/11* (2013.01); *H05K 1/117* (2013.01); *G02F 1/1345* (2013.01); *G02F 1/13452* (2013.01); *G02F 1/136286* (2013.01); *G06F 3/045* (2013.01); *G06F 2203/04107* (2013.01); *H05K 2201/0108* (2013.01); *H05K 2201/09227* (2013.01)

(58) Field of Classification Search
USPC .......... 33/748, 760, 772; 345/174; 349/151, 349/152
See application file for complete search history.

(56) References Cited

U.S. PATENT DOCUMENTS

| | | | |
|---|---|---|---|
| 6,683,669 B1 * | 1/2004 | Fujikawa | G02F 1/1345 349/149 |
| 2007/0206146 A1 | 9/2007 | Wang | |
| 2008/0237665 A1 | 10/2008 | Shishido | |
| 2012/0118614 A1 | 5/2012 | Kuriki | |
| 2012/0327020 A1 * | 12/2012 | Kohara | G02F 1/13338 345/174 |

FOREIGN PATENT DOCUMENTS

| | | |
|---|---|---|
| JP | 2011-129112 A | 6/2011 |
| JP | 2012-043298 A | 3/2012 |
| JP | 2013-045262 A | 3/2013 |

* cited by examiner

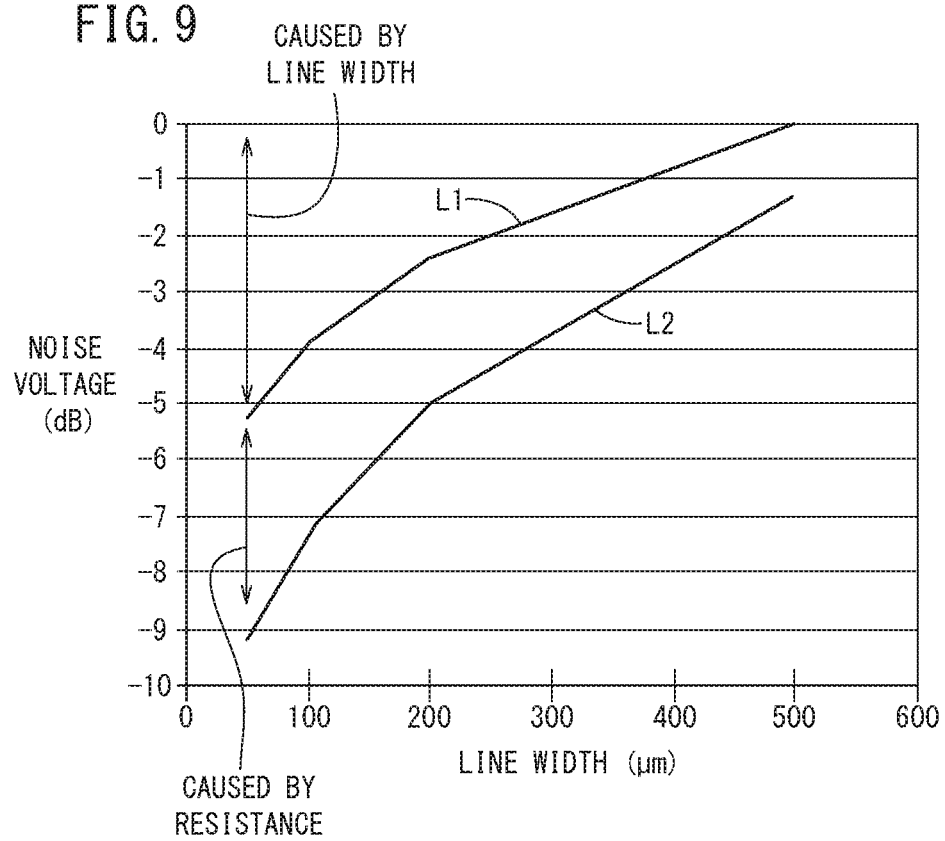

WIRING SUBSTRATE

CROSS-REFERENCE TO RELATED APPLICATIONS AND PRIORITY CLAIM

This application is a Continuation of International Application No. PCT/JP2014/068141 filed on Jul. 8, 2014, which was published under PCT Article 21(2) in Japanese, which is based upon and claims the benefit of priority from Japanese Patent Application No. 2013-146601 filed on Jul. 12, 2013, the contents all of which are incorporated herein by reference.

TECHNICAL FIELD

The present invention relates to a wiring board (substrate) which is capable of preventing an electronic circuit (integrated circuit or the like) electrically connected thereto, for example, from being broken due to an electrostatic discharge applied thereto, and which is suitable for use in a touch screen panel, for example.

BACKGROUND ART

Recently, liquid crystal panels, etc. have been suffering the problem of an electrostatic discharge breakdown during their manufacturing process. In order to solve the problem, there have been proposed technologies disclosed in Japanese Laid-Open Patent Publication No. 05-216062 and Japanese Laid-Open Patent Publication No. 05-198806.

For position input devices such as touch screen panels or the like, there have been proposed a structure for reducing the electric resistance of interconnects from transparent electrodes to an IC (see Japanese Laid-Open Patent Publication No. 2012-043298) and a structure for reducing the difference between resistance values of a plurality of interconnects thereby to reduce the difference between RC time constants of the interconnects (see Japanese Laid-Open Patent Publication No. 2010-140041).

SUMMARY OF INVENTION

A touch screen panel has a wiring board with a number of electrodes formed thereon for detecting a touched position and a control circuit (electronic component such as an integrated circuit or the like) that is electrically connected to the wiring board. The electrodes and the control circuit are electrically connected to each other by a plurality of terminal interconnects that are formed in a peripheral area of the wiring board.

Shield interconnects that are kept at a constant potential (e.g., ground potential) are formed in the peripheral area of the wiring board, particularly outside of the region where the terminal interconnects are disposed. The shield interconnects serve to prevent a noise current due to an electrostatic discharge from flowing into the control circuit or the electrodes, i.e., for protection against electrostatic discharge noise.

The touch screen panel incorporates the shield interconnects outside of the terminal interconnects for protection against electrostatic discharge noise. However, the recent trends toward larger screen sizes make it impossible for shield interconnects to prevent a noise current caused by an electrostatic discharge in a central screen area from flowing into the control circuit.

It is conceivable that touch screen panels may be protected against electrostatic discharge noise by the approaches according to Japanese Laid-Open Patent Publication No. 05-216062 and Japanese Laid-Open Patent Publication No. 05-198806. However, the protection of liquid crystal display panels against electrostatic breakdown serves to prevent TFTs (Thin-Film Transistors) in the panels from an electrostatic breakdown due to an electrostatic discharge applied from outside of the terminal interconnects. Therefore, the above approaches are not applicable to attempts to prevent a noise current caused by an electrostatic discharge in a central screen area from flowing into the control circuit.

Japanese Laid-Open Patent Publication No. 2012-043298 reveals a structure for reducing the electric resistance of an interconnect pattern from the electrodes to the IC. Japanese Laid-Open Patent Publication No. 2010-140041 shows a structure for reducing the difference between resistance values of terminal interconnects thereby to reduce the difference between RC time constants of the terminal interconnects. However, these structures are not applicable as a structure for preventing a noise current caused by an electrostatic discharge in a central screen area from flowing into the control circuit.

The present invention has been made in view of the above problems. It is an object of the present invention to provide a wiring board which is capable of realizing (1) and (2) below.

(1) It is possible to prevent a noise current caused by an electrostatic discharge in terminal interconnects and a central screen area from flowing into a control circuit.

(2) It is possible to promote an increase in the screen size of a touch screen panel, for example.

[1] A wiring board according to the present invention has an insulating board and an electroconductive section disposed on a surface of the insulating board, wherein the electroconductive section includes a plurality of electrodes disposed on the surface of the insulating board, a plurality of terminals disposed on the surface of the insulating board in corresponding relation to the electrodes, for electric connection to an external circuit, and terminal interconnects disposed on the surface of the insulating board and configured to electrically connect the electrodes respectively to the terminals corresponding thereto, a line width of a portion of each of the terminal interconnects which lies within a circle having a radius of 10 mm about a boundary between the terminal interconnect and the corresponding one of the terminals is configured to be 5 μm or greater and 100 μm or smaller, and an interconnect resistance value of each of the terminal interconnects is configured to be 100 ohms or greater and 10 kohms or smaller.

Generally, it is desirable to insert and connect protective resistance devices between the external circuit and the terminal interconnects for the purpose of preventing a noise current generated by an electrostatic discharge from flowing into the external circuit. According to the present invention, conditions for providing a function equivalent to such protective resistance devices on the wiring board have been found. Specifically, by satisfying the above arrangements, it is possible to prevent a noise current generated by an electrostatic discharge which is caused in a central screen area in addition to the terminal interconnects from flowing into the external circuit, while holding an increase in the resistance value of the terminal interconnects to a minimum. As a result, an increase in the screen size of a touch screen panel, for example, can be promoted.

[2] According to the present invention, the smaller the line width of the portion of each of the terminal interconnects which lies within the circle having the radius of 10 mm about the boundary between the terminal interconnect and the corresponding one of the terminals is, the more effective it is to protect against electrostatic discharge noise. On the other hand, on condition that the line width of the interconnects is too small, the possibility that they will break increases. The line width should preferably be in the range "from 10 µm to 100 µm (10 µm or greater and 100 µm or smaller)" and more preferably "from 10 µm to 50 µm (10 µm or greater and 50 µm or smaller)". The line width of the interconnects is determined in view of the electroconductivity of the material thereof, the manufacturing capability, the problems such as the breaking of the interconnects, etc.

[3] The resistance value of each of the terminal interconnects should preferably be 200 ohms or greater and 5 kohms or smaller.

[4] Those terminal interconnects which fail to satisfy a predetermined resistance value due to limitations on the electroconductivity thereof, the thickness thereof, and the width thereof may extend tortuously longer than a linear distance.

[5] Those terminal interconnects which fail to satisfy a predetermined resistance value due to limitations on the electroconductivity thereof, the thickness thereof, and the width thereof may have at least one bend.

[6] The portion that lies in the circle having the radius of 10 mm should preferably have a pattern in which the bend is repeated at least once, and the pattern should preferably have an interval which is at least twice greater than the line width of the pattern.

[7] The range in which the line width of each of the terminal interconnects is limited represents the portion lying in the circle having the radius of 10 mm about the boundary between the terminal interconnect and the corresponding terminal. On condition that another measure, e.g., an electrostatic breakdown prevention structure in a casing that carries a touch sensor panel, is employed in the above range, then the boundary on such an electrostatic breakdown prevention measure may be regarded as the base point of the circle having the radius of 10 mm.

[8] An electrode film which is kept at a constant potential may be formed on a reverse side of the insulating board in a portion thereof which is close to the terminals and face a portion of each of the terminal interconnects. In this case, capacitors are formed between the portions of the terminal interconnects which are close to the respective terminals and the electrode film. Static electricity generated in the terminal interconnects and the central screen area can temporarily be stored in the capacitors and then gradually discharged, making the wiring board resistant to an electrostatic discharge.

[9] The electroconductive section should preferably be made of a single electroconductive material, and the single electroconductive material should preferably comprise a metal which is one of silver, copper, and aluminum, or an alloy containing at least one of silver, copper, and aluminum. The electroconductive section should preferably have an electroconductivity in a range of $1 \times 10^6$ to $5 \times 10^6$ S/m.

[10] The line width of portions of each of the terminal interconnects other than the portion which lies in the circle having the radius of 10 mm about the boundary between the terminal interconnect and the corresponding terminal should preferably be in the range of 20-200 µm. The line width is determined in view of the electroconductivity of the terminal interconnects, the thickness of the terminal interconnects, the resistance value of the terminal interconnects, and the design of a panel which incorporates the wiring board, etc.

[11] According to the present invention, the electroconductive section may have a plurality of electrodes disposed as a transparent electroconductive layer on the surface of the insulating board, a plurality of terminals disposed on the surface of the insulating board in corresponding relation to the electrodes, for electric connection to an external circuit, and terminal interconnects disposed on the surface of the insulating board and electrically connecting the electrodes respectively to the terminals corresponding thereto, and the electroconductive section may have the same thickness in the electrodes, the terminals, and the terminal interconnects.

The wiring board according to the present invention is effective to prevent a noise current due to an electrostatic discharge caused in peripheral and central screen areas from flowing into a control circuit, and to promote an increase in the screen size of a touch screen panel, for example.

The above objects, features, and advantages of the present invention will easily be understood from the following description of embodiments taken in conjunction with the accompanying drawings.

BRIEF DESCRIPTION OF DRAWINGS

FIG. 9 is a characteristics diagram showing changes caused in induced noise (noise voltage) at the time the line width and electroconductivity of first terminal interconnects are changed, given that a case is used as a reference (0 dB) in which the first terminal interconnects are a perfect conductor and a line width is 500 µm;

DESCRIPTION OF EMBODIMENTS

Embodiments where a wiring board according to the present invention is applied to a touch screen panel, for example, will be described below with reference to FIGS. 1 through 12. The symbol "-" (to) indicating numerical ranges in the present description is used to mean that numerical values inserted before and after the symbol are covered as upper and lower limit values of the ranges. In the present description, electrode patterns of a substantially rectangular shape are employed. However, electrode shapes are not limited to such a shape, but the present invention is also applicable to a pattern wherein electrodes are constructed as a combination of lozenge shapes.

Figure 1:
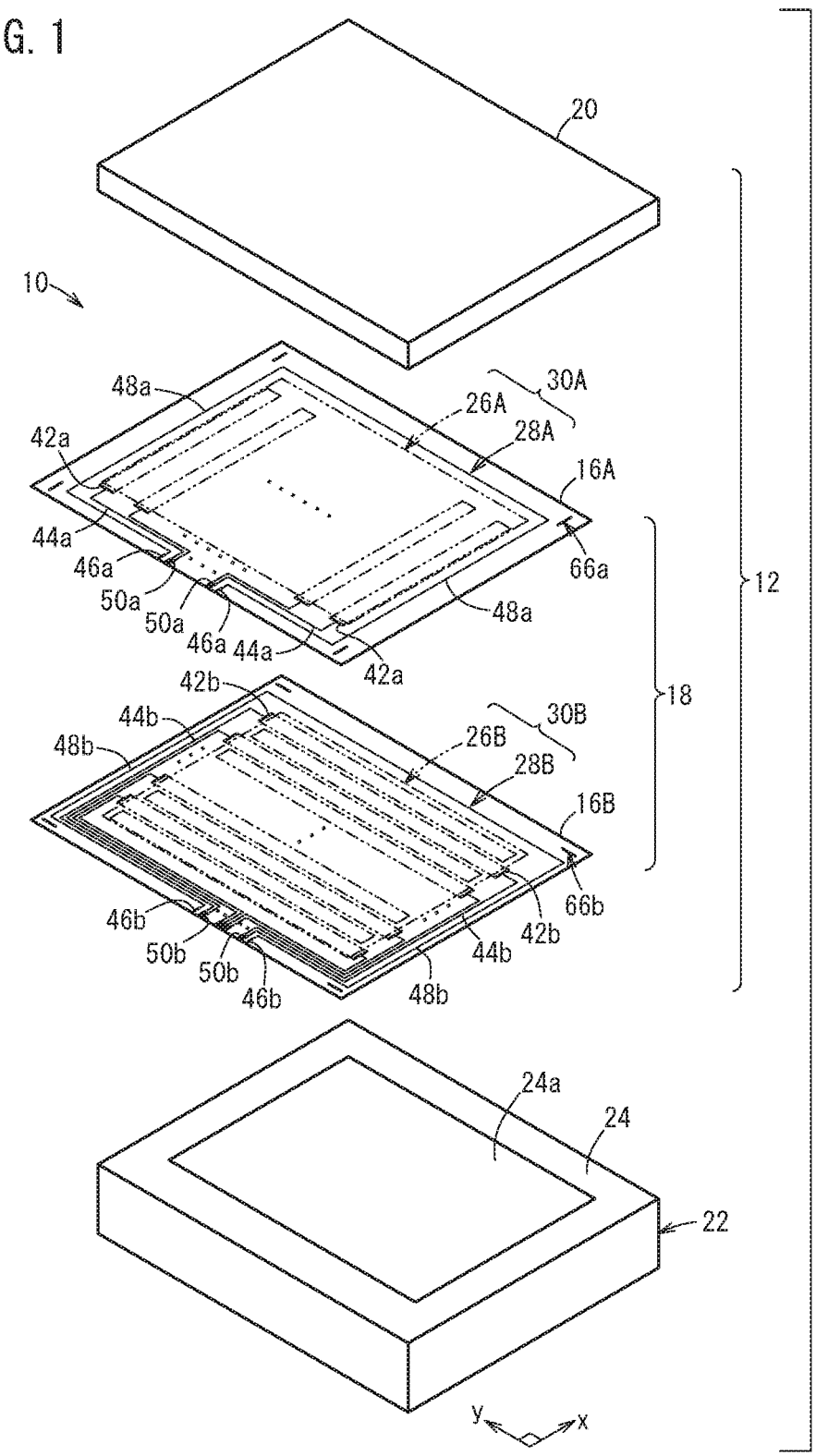
FIG. 1 is an exploded perspective view showing a structural example wherein a wiring board according to an embodiment is applied to a touch screen panel.
Figure 2:
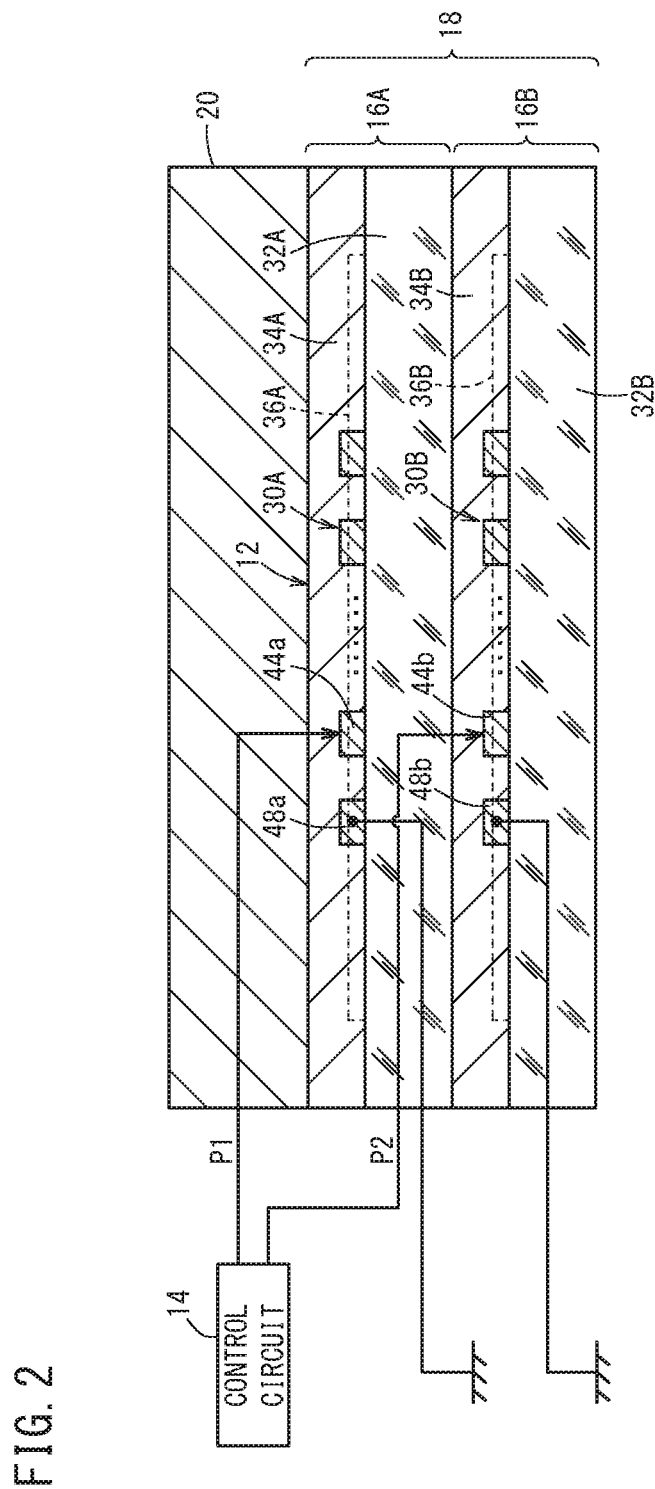
FIG. 2 is a view illustrating an example of a cross-sectional structure of a laminated electroconductive film and an example of a control system (self-capacitance system)

As shown in FIG. 1, a touch screen panel 10 to which a wiring board according to an embodiment of the present invention is applied has a sensor assembly 12 and a control circuit 14 (comprising an IC or the like, see FIG. 2). The sensor assembly 12 has a laminated electroconductive film assembly 18 that comprises a stack of a first electroconductive film 16A (wiring board) and a second electroconductive film 16B (wiring board), and a cover layer 20 made of glass, for example, which is stacked on the laminated electroconductive film assembly 18. The laminated electroconductive film assembly 18 and the cover layer 20 are disposed on a display panel 24 of a display device 22 such as a liquid crystal display or the like, for example. The first electroconductive film 16A and the second electroconductive film 16B, as seen from above, include a first sensor area 26A and a second sensor area 26B, respectively, which correspond to a display screen 24a of the display panel 24, and a first terminal interconnect area 28A and a second terminal interconnect area 28B (so-called frames), respectively, which correspond to an outer peripheral area of the display panel 24.

As shown in FIG. 2, the first electroconductive film 16A has a first transparent base 32A, a first electroconductive section 30A formed on the surface of the first transparent base 32A, and a first transparent adhesive layer 34A formed in covering relation to the first electroconductive section 30A.

Figure 3:
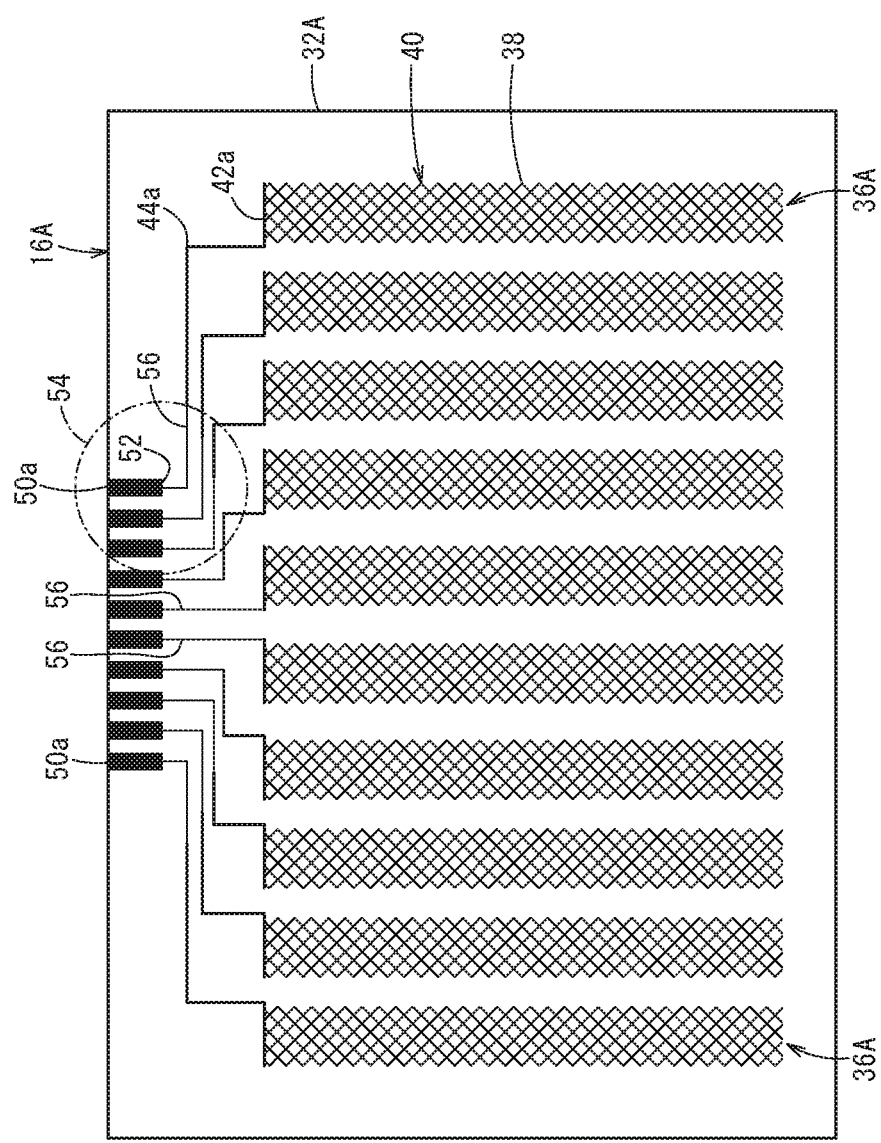
FIG. 3 is a plan view, as seen from above, of essential parts (first electrodes, first junctions, first terminal interconnects, and first terminals) of a first electroconductive film.

As shown in FIGS. 1 and 3, the first sensor area 26A includes a plurality of first electrodes 36A as a transparent electroconductive layer comprising fine metal lines. The first electrodes 36A each have a strip-shape mesh pattern 40 (see FIG. 3) comprising a number of grids 38 combined together (see FIG. 3), and extend in a first direction (x direction) and are arrayed in a second direction (y direction) perpendicular to the first direction.

On the first electroconductive film 16A arranged as described above, first terminal interconnects 44a as metal interconnects are electrically connected to respective ends of the first electrodes 36A on one side by respective first junctions 42a.

Specifically, as shown in FIG. 2, the first electroconductive film 16A that is applied to the touch screen panel 10 has the number of first electrodes 36A, referred to above, arrayed in a portion corresponding to the first sensor area 26A, and the plurality of first terminal interconnects 44a arrayed in the first terminal interconnect area 28A and extending from the respective first junctions 42a. As shown in FIG. 1, a first ground line 48a that serves the purpose of providing a shield effect is formed outside of the first terminal interconnects 44a in surrounding relation to the first sensor area 26A from a first ground terminal 46a to another first ground terminal 46a.

In the example shown in FIG. 1, the outer shape of the first electroconductive film 16A is rectangular as seen in plan, whereas the outer shape of the first sensor area 26A is also rectangular. The first terminal interconnect area 28A includes, on a peripheral edge of one longer side of the first electroconductive film 16A, a plurality of first terminals 50a arrayed along the longitudinal directions of the longer side in a central region along the longitudinal directions, in addition to the above pair of first ground terminals 46a. The plurality of first junctions 42a are linearly arrayed along the longer side of the first sensor area 26A (the longer side closest to the longer side of the first electroconductive film 16A: y direction). The first Terminal interconnects 44a that extend from the respective First junctions 42a extend tortuously toward a substantially Central region of the longer side of the first electroconductive film 16A and are electrically connected to the corresponding first terminals 50a.

As shown in FIG. 2, the second electroconductive film 16B has a second transparent base 32B, a second electroconductive section 30B formed on the surface of the second transparent base 32B, and a second transparent adhesive layer 34B formed in covering relation to the second electroconductive section 30B.

As shown in FIG. 1, as is the case with the first electroconductive film 16A, the second sensor area 26B has a plurality of second electrodes 36B as a transparent electroconductive layer comprising fine metal lines. Although not shown, as is the case with the first electrodes 36A, the second electrodes 36B each have a strip-shape mesh pattern 40 comprising a number of grids 38 combined together, and extend in a second direction (y direction) and are arrayed in the first (x direction).

On the second electroconductive film 16B arranged as described above, second terminal interconnects 44b as metal interconnects are electrically connected to respective ends of odd-numbered second electrodes 36B on one side, for example, and respective other ends of even-numbered second electrodes 36B by respective second junctions 42b.

Specifically, as shown in FIG. 1, the second electroconductive film 16B that is applied to the touch screen panel 10 has the number of second electrodes 36B arrayed in a portion corresponding to the second sensor area 26B and a plurality of second terminal interconnects 44b arrayed in the second terminal interconnect area 28B and extending from the respective second junctions 42b. A second ground line 48b that serves the purpose of providing a shield effect is formed outside of the second terminal interconnects 44b in surrounding relation to the second sensor area 26B from a second ground terminal 46b to another second ground terminal 46b.

As shown in FIG. 1, the second terminal interconnect area 28B includes, on a peripheral edge of one longer side of the second electroconductive film 16B, a plurality of second terminals 50b arrayed along the longitudinal directions of the longer side in a longitudinally central region, in addition to the above pair of second ground terminals 46b. A plurality of second junctions 42b (e.g., odd-numbered second junctions 42b) are linearly arrayed along a shorter side of the second sensor area 26B (the shorter side closest to the shorter side of the second electroconductive film 16B: x direction). A plurality of second junctions 42b (e.g., even-numbered second junctions 42b) are linearly arrayed along another shorter side of the second sensor area 26B (the shorter side closest to the other shorter side of the second electroconductive film 16B: x direction).

Of the second electrodes 36B, odd-numbered second electrodes 36B, for example, are connected to the corresponding odd-numbered second junctions 42b, whereas even-numbered second electrodes 36B are connected to the corresponding even-numbered second junctions 42b. The second terminal interconnects 44b that extend from the odd-numbered second junctions 42b and the second terminal interconnects 44b that extend from the even-numbered second junctions 42b extend tortuously toward a substantially central region of the longer side of the second electroconductive film 16B and are electrically connected to the corresponding second terminals 50b.

The first terminal interconnects 44a may extend in the same manner as the second terminal interconnects 44b, and the second terminal interconnects 44b may extend in the same manner as the first terminal interconnects 44a.

In a case where the laminated electroconductive film assembly 18 is to be used in the touch screen panel 10, the cover layer 20 is stacked on the first electroconductive film 16A. The first terminal interconnects 44a that extend from the numerous first electrodes 36A of the first electroconductive film 16A and the second terminal interconnects 44b that extend from the numerous second electrodes 36B of the second electroconductive film 16B are connected to the control circuit 14 (see FIG. 2), which controls a scanning process, for example.

Figure 4:
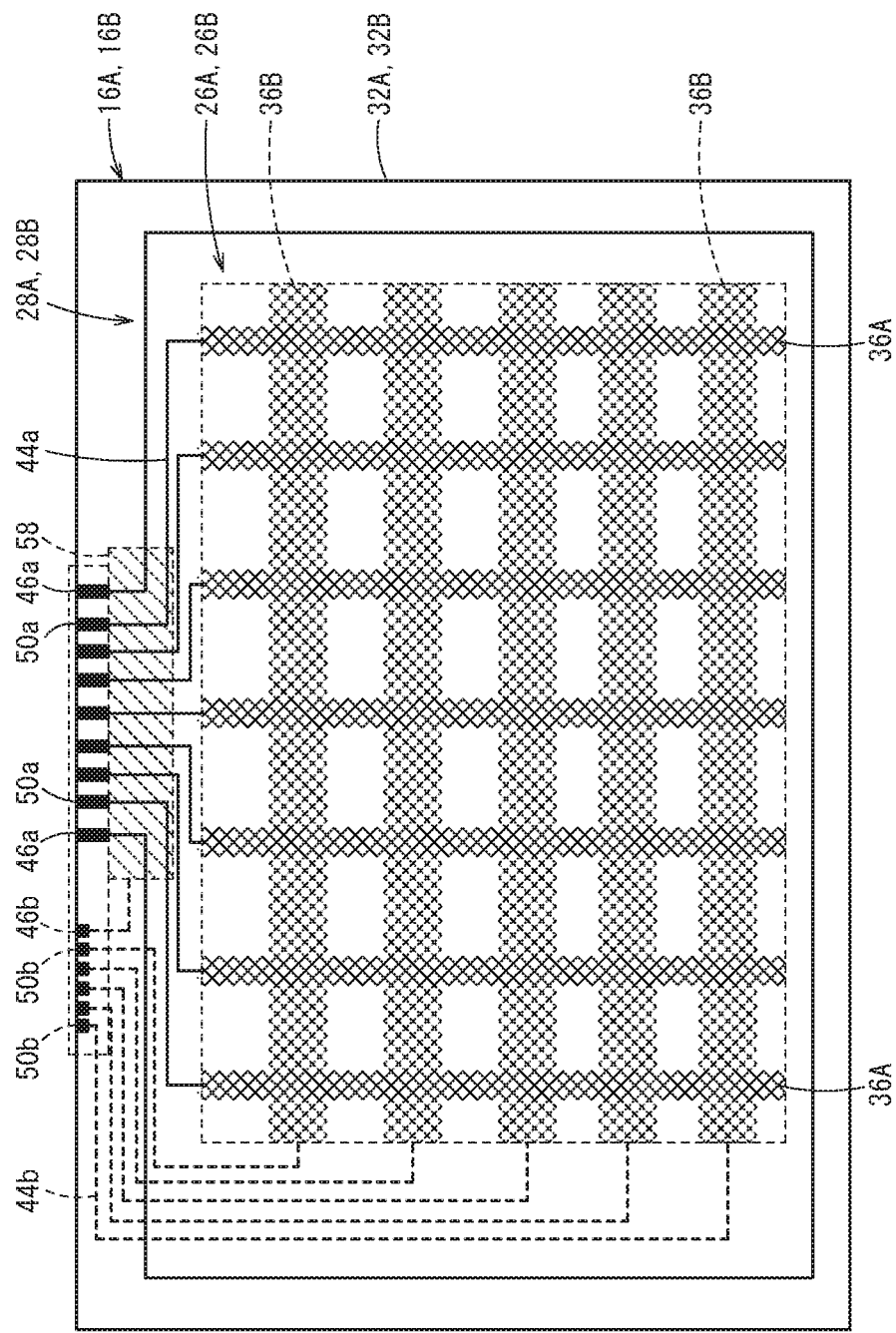
FIG. 4 is a plan view showing, together with a pattern of first electroconductive sections, another example of a pattern of second electroconductive sections formed on a second electroconductive film.

The second electroconductive section 30B formed on the second electroconductive film 16B may also preferably be of a pattern shown in FIG. 4, as well as the above pattern shown in FIG. 1. FIG. 4 is a plan view, as seen from above, of the first electroconductive film 16A and the second electroconductive film 16B that are stacked together.

As shown in FIG. 4, the second terminal interconnects 44b as metal interconnects are electrically connected to respective ends of the second electrodes 36B on one side by respective second junctions 42b. An electrode film 58 is formed in the second terminal interconnect area 28B at a position facing the first terminal interconnects 44a of the first electroconductive film 16A, and is electrically connected to the second ground terminal 46b.

A system for detecting a touched position may preferably be a self-capacitance system or a mutual capacitance system.

According to the self-capacitance system, as shown in FIG. 2, the control circuit 14 supplies a first pulse signal P1 for detecting a touched position sequentially to the first terminal interconnects 44a, and supplies a second pulse signal P2 for detecting a touched position sequentially to the second terminal interconnects 44b.

In a case where a fingertip is brought into contact with or in the vicinity of the upper surface of the cover layer 20, the capacitance between the first electrode 36A and the second electrode 36B which face the touched position and GND (ground) increases. Therefore, the waveform of a signal transmitted from the first electrode 36A and the second electrode 36B becomes different from the waveforms of signals transmitted from the other electrodes. Consequently, the control circuit 14 calculates the touched position on the basis of the transmitted signals supplied from the first electrodes 36A and the second electrodes 36B.

Figure 5:
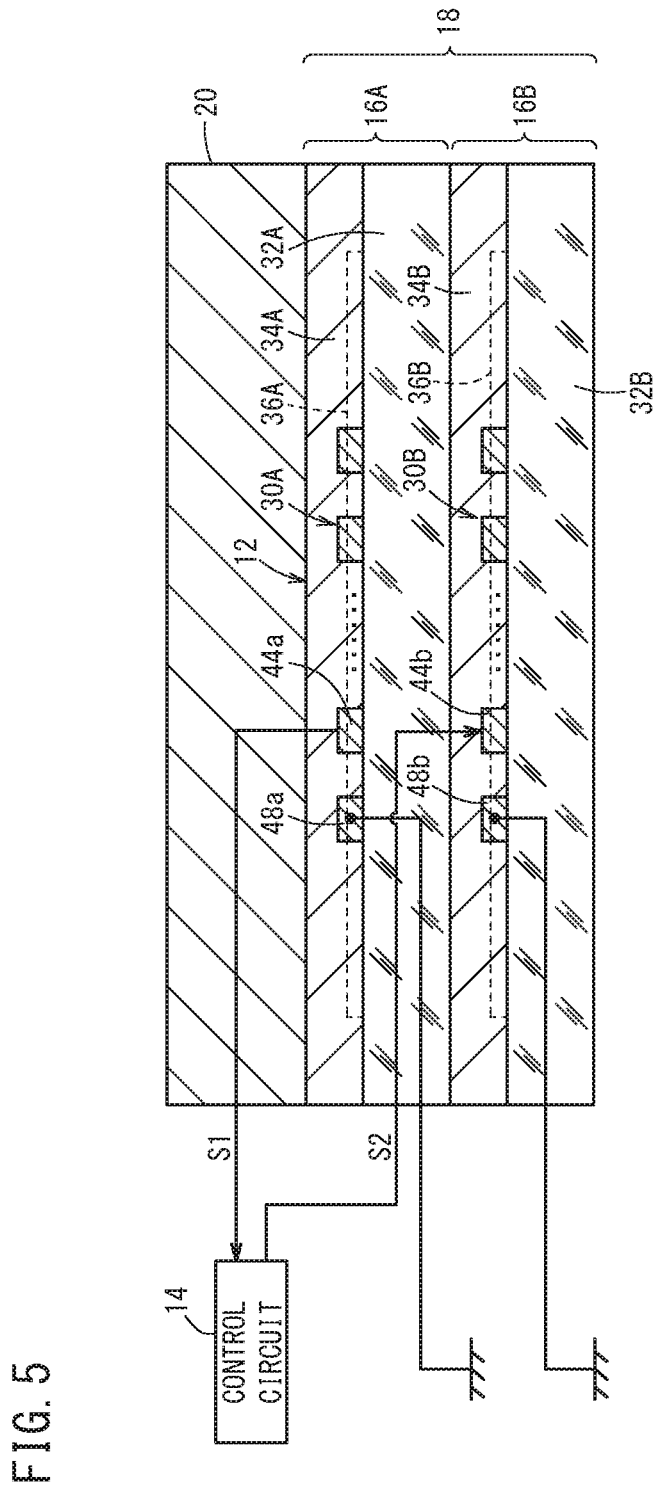
FIG. 5 is a view illustrating an example of a cross-sectional structure of a laminated electroconductive film and an example of a control system (mutual-capacitance system)

According to the mutual capacitance system, as shown in FIG. 5, the control circuit 14 applies a voltage signal S2 for detecting a touched position sequentially to the second electrodes 36B, and performs a sensing process (to detect a transmitted signal S1) sequentially on the first electrodes 36A. In a case where a fingertip is brought into contact with or in the vicinity of the upper surface of the cover layer 20, the stray capacitance of the finger is added parallel to the parasitic capacitance between the first electrode 36A and the second electrode 36B which face the touched position. Therefore, the waveform of the transmitted signal S1 from the second electrode 36B becomes different from the waveforms of the transmitted signals S1 from the other second electrodes 36B. Consequently, the control circuit 14 calculates the touched position on the basis of the sequence of the second electrodes 36B to which the voltage signal S2 is supplied and the transmitted signals S1 supplied from the first electrodes 36A.

According to the self-capacitance or mutual capacitance system for detecting a touched position, even in a case where two fingertips are simultaneously brought into contact with or in the vicinity of the upper surface of the cover layer 20, it is possible to detect the respective touched positions.

Background art documents about detection circuits of the projection-type electrostatic capacitance type include U.S. Pat. Nos. 4,582,955, 4,686,332, 4,733,222, 5,374,787, 5,543,588, 7,030,860, and U.S. Patent Application Publication No. 2004/0155871.

According to the present embodiment, except for structural examples to be described later, the joints between the first terminal interconnects 44a and the first electrodes 36A are set in order to make as short as possible the distance over which the first terminal interconnects 44a on at least the first electroconductive film 16A extend tortuously. For example, on condition that the first terminals 50a are positioned in the longitudinally central portion of the first electroconductive film 16A, as shown in FIG. 3, the joints are set as follows: The first terminal interconnects 44a that exist on the right side, for example, have their joints to the corresponding first electrodes 36A, positioned on the respective left sides. Conversely, the first terminal interconnects 44a that exist on the left side have their joints to the corresponding first electrodes 36A, positioned on the respective right sides. In particular, the first terminal interconnects 44a that are connected to two, in the central portion, of the first terminals 50a extend straight without being tortuous or bent. The resistance value of the shortest first terminal interconnects 44a in the central portion is a low value of up to several 10 ohms.

According to the present embodiment, the first terminal interconnects 44a are further arranged as follows:

(a) A portion of each of the first terminal interconnects 44a which lies within a circle having a radius of 10 mm about a boundary 52 between itself and the corresponding first terminal 50a is of a structure having a portion where the line width ranges "from 5 µm to 100 µm (5 µm or greater and 100 µm or smaller)", preferably from "from 10 µm to 100 µm (10 µm or greater and 100 µm or smaller)", and more preferably "from 10 µm to 50 µm (10 µm or greater and 50 µm or smaller)". Specifically, as shown in FIG. 3, the line width of a portion 56 (a portion indicated by a thin line in FIG. 3) of the first terminal interconnect 44a positioned on the right end which lies within a circle 54 having a radius of 10 mm about the boundary 52 between itself and the corresponding first terminal 50a on the right end ranges "from 10 µm to 50 µm (10 µm or greater and 50 µm or smaller)". The same holds true for the other first terminal interconnects 44a.

(b) The interconnect resistance value of each of the first terminal interconnects 44a is set to be "100 ohms or greater or preferably 200 ohms or greater" and "10 kohms or smaller or preferably 5 kohms or smaller".

Generally, on a wiring board used in the touch screen panel 10, a noise current is induced in the first electrodes 36A by an electrostatic discharge developed on the touch screen panel 10. The noise current flows through the first terminal interconnects 44a and the first terminals 50a into the control circuit 14, possibly resulting in a situation where the control circuit 14 may be broken at worst. The first ground line 48a formed outside of the first terminal interconnects 44a is provided as a means for preventing such a situation. However, owing to the recent trends toward larger screen sizes, it has become impossible to prevent a noise current caused by an electrostatic discharge in a central screen area from flowing into the control circuit 14. In order to solve this problem, it is desirable to insert and connect protective resistance devices between the control circuit 14 and the first terminal interconnects 44a.

According to the present embodiment, the interconnect resistance of the first terminal interconnects 44a near the first terminals 50a is increased for the purpose of preventing a noise current caused by an electrostatic discharge from flowing into the control circuit 14. In other words, conditions for providing a function equivalent to such protective resistance devices on the wiring board have been found. Specifically, the smaller the line width of the first terminal interconnects 44a is, the smaller the effect of an electrostatic discharge becomes, and since the interconnect resistance of the first terminal interconnects 44a becomes greater in inverse proportion to the line width, it is able to prevent a noise current due to an electrostatic discharge from being transmitted.

The results of a simulation carried out on the relationship between noise due to an electrostatic discharge, and the line width of the terminal interconnects and the electroconductivity of the terminal interconnects will be described below with reference to FIGS. 6 through 9.

Figure 6:
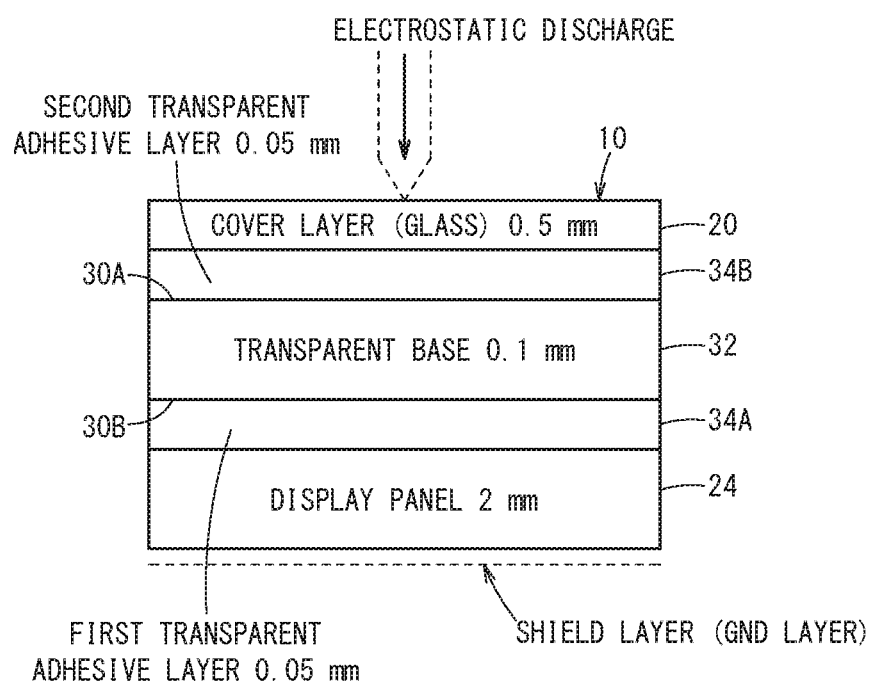
FIG. 6 is a view illustrating a layer makeup of a touch screen panel used in a simulation and the thicknesses of respective layers.

FIG. 6 is a view illustrating a layer makeup of the touch screen panel 10 used in the simulation and the thicknesses of respective layers. A transparent base 32 having a thickness of 0.1 mm and made of polyethylene terephthalate is stacked on the display panel 24 (having a thickness of 2 mm) of the display device 22 with the first transparent adhesive layer 34A having a thickness of 0.05 mm being interposed therebetween. The cover layer 20 having a thickness of 0.5 mm and made of glass is stacked on the transparent base 32 with the second transparent adhesive layer 34B having a thickness of 0.05 mm being interposed therebetween. A shield layer (GND layer) is disposed on an end face of the display panel 24.

In the simulation, it is assumed that an electrostatic discharge is developed on the uppermost cover layer 20. The first electroconductive section 30A is formed on the face side (closer to the cover layer 20) of the transparent base 32, and the second electroconductive section 30B is formed on the reverse side (closer to the display panel 24) of the transparent base 32.

Figure 7:
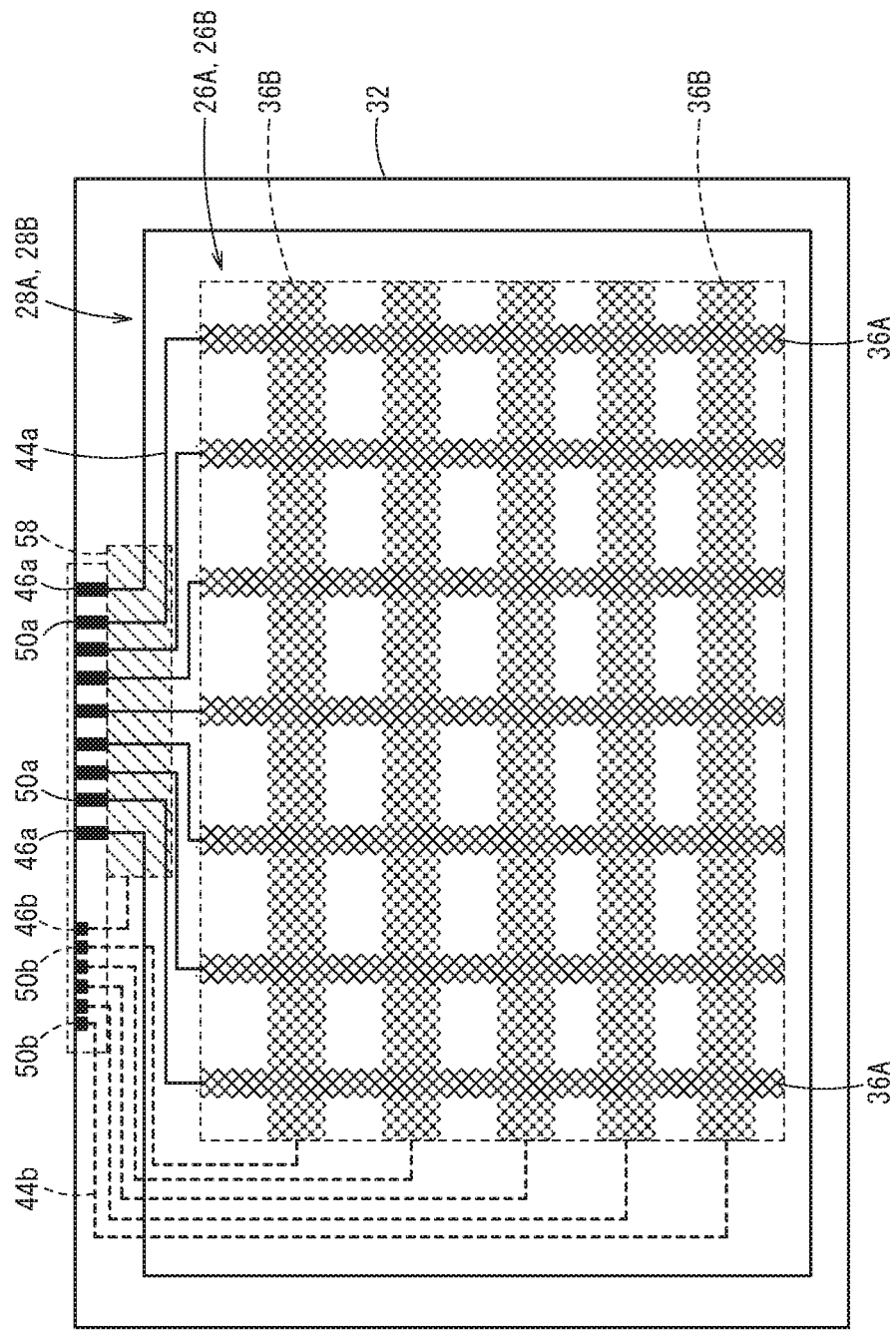
FIG. 7 is a plan view showing a structural example of a first electroconductive section and a second electroconductive section formed on the face and reverse sides of a transparent base of the touch screen panel.

FIG. 7 shows a structural example of the first electroconductive section 30A and the second electroconductive section 30B formed on the face and reverse sides of the transparent base 32 of the touch screen panel 10. The first electrodes 36A, the second electrodes 36B, the first terminal interconnects 44a, and the second terminal interconnects 44b are of the same pattern as the pattern shown in FIG. 4. In FIG. 4, the first terminal interconnects 44a and the second terminal interconnects 44b are all assumed to have the same thickness.

Although not shown, the first terminals 50a formed on the face side of the transparent base 32 and the second terminals 50b formed on the reverse side of the transparent base 32 are electrically connected to the external control circuit 14.

Figure 8:
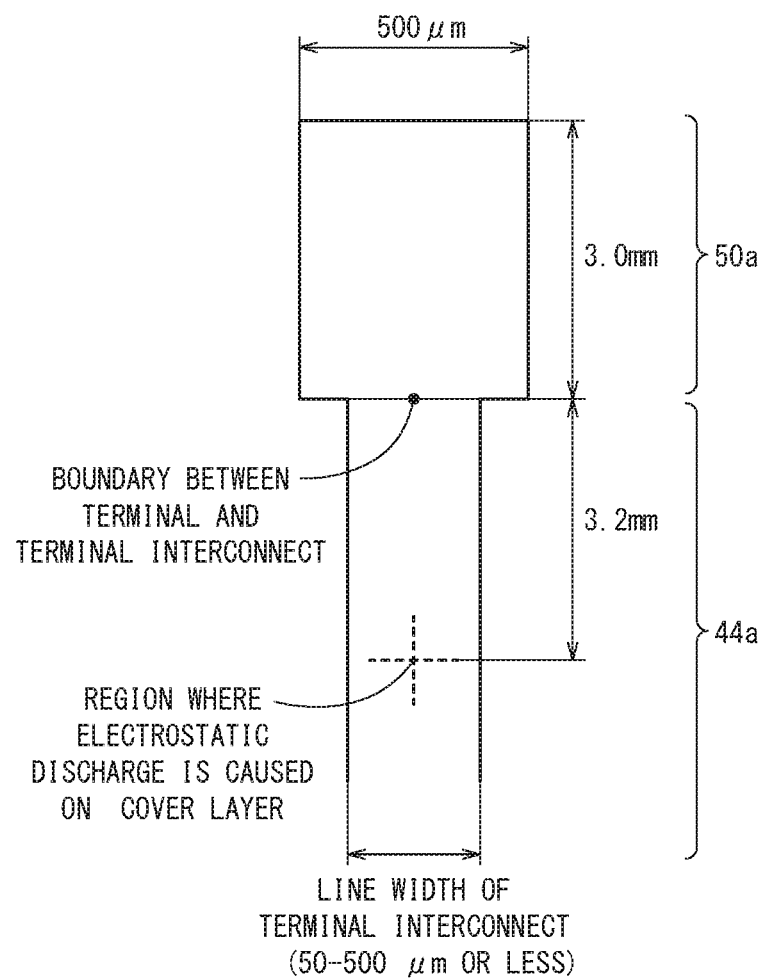
FIG. 8 is an enlarged view showing details of a joint between a first terminal and a first terminal interconnect.

FIG. 8 is an enlarged view showing details of the joint between a first terminal 50a and a first terminal interconnect 44a.

In the simulation, noise induced in a first terminal interconnect 44a that is disposed directly below a region where an electrostatic discharge is caused, of the face side of the cover layer 20 is propagated through the first terminal 50a to the external control circuit 14. Voltages produced at this time (induced noise voltages) are shown in FIG. 9.

Specifically, FIG. 9 shows changes caused in induced noise at the time the line width and electroconductivity of the first terminal interconnects 44a are changed given that a case in which the first terminal interconnects 44a are a perfect conductor and a line width is 500 μm is used as a reference (0 dB). A solid-line curve L1 in FIG. 9 indicates changes in the noise voltage at the time the line width of the first terminal interconnects 44a as a perfect conductor is changed (the line width dependency of noise induced in a perfect conductor). A solid-line curve L2 in FIG. 9 indicates changes in the noise voltage at the time the line width of the first terminal interconnects 44a whose electroconductivity is $1 \times 10^6$ S/m (the line width dependency of noise induced in a conductor whose electroconductivity is $1 \times 10^6$ S/m).

It is indicated by the results shown in FIG. 9 that "as the line width becomes smaller, the induced noise voltage is reduced due to the line width dependency in a perfect conductor", and "the induced noise voltage is also reduced by an increase in the resistance value which is caused by a reduction in the line width".

According to the present embodiment, on the basis of the foregoing, the layout position, interconnect resistance value, and line width of a wiring pattern that performs a function as equivalent to protective resistance devices are found as a wiring pattern for preventing a noise current due to an electrostatic discharge from being transmitted to the control circuit 14. By then satisfying the arrangements (a), (b) described above, it is possible to prevent a noise current due to an electrostatic discharge caused in a central screen area as well as a peripheral screen area from flowing into the control circuit 14, thus promoting an increase in the screen size of the touch screen panel 10.

Furthermore, the wiring board (the first electroconductive film 16A in this case) used in the touch screen panel 10 includes interconnects for signal transmission such as the first terminal interconnects 44a, etc. that are formed on the first transparent base 32A made of PET (polyethylene terephthalate) or the like. In particular, the interconnects such as the first terminal interconnects 44a, etc. are required to be of low resistance for the purpose of increasing signal transmission characteristics. However, since no sufficient interconnect space is ensured due to a reduction in the frame area such as the first terminal interconnect area 28A, etc., there are limitations on the interconnect width and interconnect interval, and there are factors for increasing the resistance values, including an increase in the number of interconnects, a reduction in the width of interconnects, and an increase in the length of interconnects on account of an increase in the screen size. On the other hand, the protection against electrostatic discharge noise, which is one measure of reliability, is also one of the important items to be taken into consideration.

According to the present embodiment, the arrangements (a), (b) described above are satisfied on the above background thereby to realize the protection against electrostatic discharge noise in the wiring board for use in the touch screen panel 10 while holding an increase in the resistance value to a minimum.

A structural example for realizing (b) of the above arrangements (a), (b) may make the distance over which the first terminal interconnect 44a connected to the first terminal 50a as a target extends tortuously, longer than the linear distance up to the corresponding first electrode 36A. In this regard, according to the present embodiment, the thickness of the portion whose line width ranges "from 5 µm to 100 µm (5 µm or greater and 100 µm or smaller)" or preferably from "from 10 µm to 50 µm (10 µm or greater and 50 µm or smaller)", i.e., the portion 56 which lies within the circle 54 having the radius of 10 mm about the boundary 52 between the first terminal interconnect 44a and the corresponding first terminal 50a may be reduced, or the portion 56 may be caused to meander or be bent, rather than not making the line width of the portion 56 smaller than 10 µm.

Some specific examples (first through third specific examples) for realizing the above structural example will be described below with reference to FIGS. 10A through 10C.

Figure 10A:
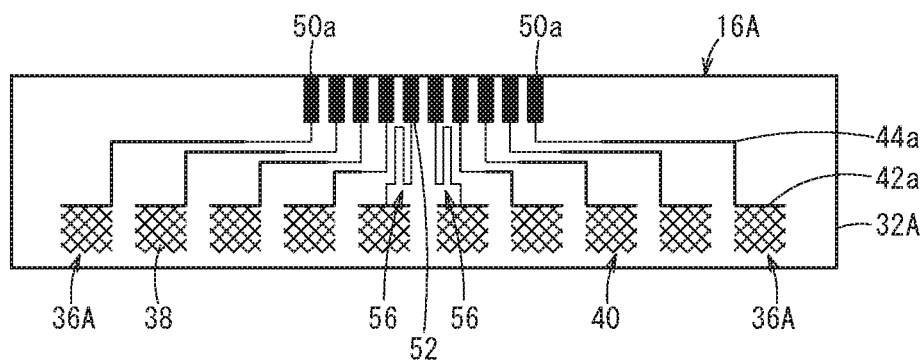
FIG. 10A is a plan view, as seen from above, of essential parts (first electrodes, first junctions, first terminal interconnects, and first terminals) of a first electroconductive film according to a first specific example.
Figure 10B:
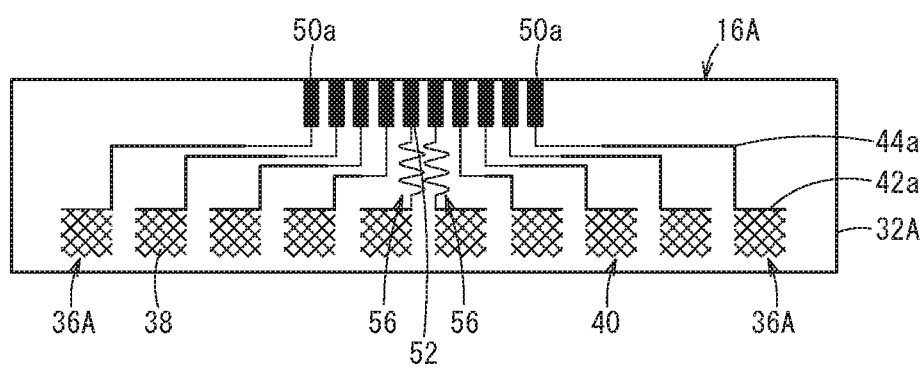
FIG. 10B is a plan view, as seen from above, of essential parts of a first electroconductive film according to a second specific example.
Figure 10C:
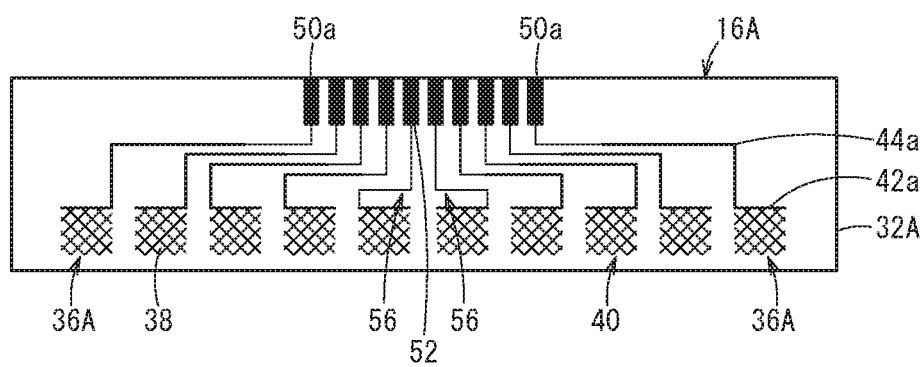
FIG. 10C is a plan view, as seen from above, of essential parts of a first electroconductive film according to a third specific example.

As shown in FIGS. 10A through 10C, according to each of the first through third specific examples, two, in the central portion, of the first terminals 50a arrayed horizontally serve as first terminals 50a as targets.

According to the first specific example, as shown in FIG. 10A, the portions 56 of the first terminal interconnects 44a connected to the target first terminals 50a which lie within respective circles each having a radius of 10 mm about boundaries 52 between themselves and the corresponding first terminals 50a extend tortuously in a meandering pattern. In the example shown in FIG. 10A, the boundaries 52 between the first terminal interconnects 44a and the corresponding first electrodes 36A are positioned centrally, and the first terminal interconnects 44a from the boundaries 52 between themselves and the first terminals 50a toward the first electrodes 36A extend tortuously in a meandering pattern. The wiring interval between the portions formed in the meandering pattern is at least twice greater than the line width of the first terminal interconnects 44a.

According to the second specific example, as shown in FIG. 10B, the portions 56 of the first terminal interconnects 44a connected to the target first terminals 50a which lie within respective circles each having a radius of 10 mm about boundaries 52 between themselves and the corresponding first terminals 50a extend tortuously in a wave-shape pattern. In the example shown in FIG. 10B, the joint between the right first terminal interconnect 44a and the corresponding first electrode 36A is positioned on the left, whereas the joint between the left first terminal interconnect 44a and the corresponding first electrode 36A is positioned on the right. The first terminal interconnects 44a from the boundaries 52 between themselves and the first terminals 50a toward the first electrodes 36A extend tortuously in a wave-shape pattern. The wiring interval between the portions formed in the wave-shape pattern is at least twice greater than the line width of the first terminal interconnects 44a.

According to the third specific example, as shown in FIG. 10C, the portions 56 of the first terminal interconnects 44a connected to the target first terminals 50a which lie within respective circles each having a radius of 10 mm about boundaries 52 between themselves and the corresponding first terminals 50a extend tortuously in a bent pattern. In the example shown in FIG. 10C, the joint between the right first terminal interconnect 44a and the corresponding first electrode 36A is positioned on the right, whereas the joint between the left first terminal interconnect 44a and the corresponding first electrode 36A is positioned on the left.

Figure 11:
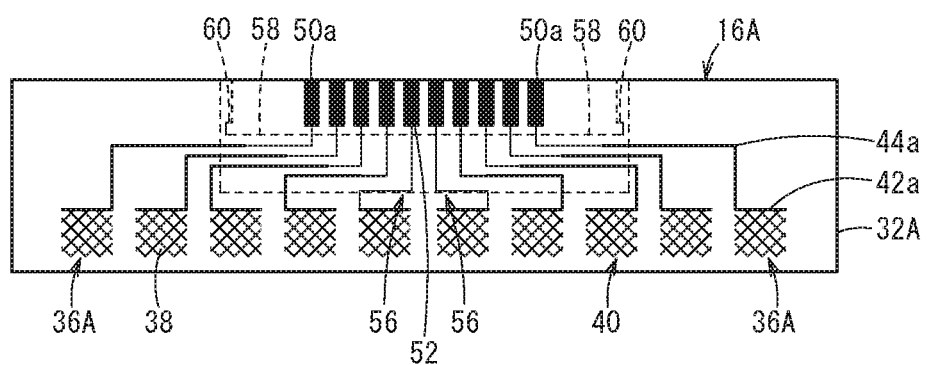
FIG. 11 is a plan view, as seen from above, of essential parts (first electrodes, first junctions, first terminal interconnects, and first terminals) of a first electroconductive film and an example of an electrode film formed on the reverse side of a first transparent base.

In addition to the arrangements (a), (b), as shown in FIG. 11, a single electrode film 58 and a connection terminal 60 that is electrically connected to the electrode film 58 are formed in a portion of the reverse side of the first transparent base 32A which is close to the first terminals 50a and which also faces respective portions of the first terminal interconnects 44a. The connection terminal 60 and GND (ground) or a constant potential may be connected to each other, keeping the electrode film 58 at the ground or constant potential. In other words, capacitors are formed between the portions of the respective first terminal interconnects 44a which are close to the respective first terminals 50a and GND, etc. Static electricity generated in the peripheral screen area and the central screen area can temporarily be stored in the capacitors and then gradually discharged, making the wiring board resistant to an electrostatic discharge. In the example shown in FIG. 11, the electrode film 58 is formed on the reverse side of the first transparent base 32A. However, as shown in FIG. 4, the electrode film 58 may be formed on the face side of the second electroconductive film 16B.

In the above examples, the arrangements (a), (b) are applied to the first terminal interconnects 44a. The arrangements (a), (b) may also be applied to the second terminal interconnects 44b in addition to the first terminal interconnects 44a.

Other preferable embodiments of the wiring board will be described below.

The metal lines that make up the first terminal interconnects 44a, the second terminal interconnects 44b, the first terminals 50a, the second terminals 50b, the first ground line 48a, the second ground line 48b, the first ground terminal 46a, and the second ground terminal 46b, and the fine metal lines that make up the transparent electroconductive layer are made of a single electroconductive material. The single electroconductive material comprises a metal which is one of silver, copper, and aluminum, or an alloy containing at least one of these metals.

The length of one side of the grids 38 should preferably be in the range of 50~500 µm and more preferably be in the range of 150~300 µm. On condition that the length of one side is smaller than the above lower limit value, then since the electrostatic capacitance at the time of detection is reduced, the possibility of a detection failure is high. On condition that the length of one side is greater than the above upper limit value, then the accuracy of positional detection tends to decrease. On condition that the grids 38 fall in the above range, then it is possible to keep the transparency good, so that in a case where the wiring board is applied to the display panel 24 of the display device 22, it allows the viewer to visually recognize displayed information without a sense of incongruity.

The line width of the fine metal lines that make up the first electrodes 36A and the second electrodes 36B is in the range of 1-9 µm. The line width of the first electrodes 36A may be the same as or different from the line width of the second electrodes 36B.

Specifically, the line width of the fine metal lines that make up the transparent electroconductive layer should preferably have a lower limit of 1 µm or greater, or 3 µm or greater, or 4 µm or greater, or 5 µm or greater, and an upper limit of 9 µm or smaller or 8 µm or smaller. On condition that the line width is smaller than the above lower limit value, then since the electroconductivity of the transparent electroconductive layer becomes insufficient, they have insufficient detection sensitivity in use on touch screen panels 10.

On condition that the line width exceeds the above upper limit value, then moire becomes distinctive, and visibility becomes poor in use on touch screen panels 10. The line width in the above range is effective to improve moire in the first sensor area 26A and the second sensor area 26B, making visibility better in particular. The line interval (the distance between adjacent fine metal lines) should preferably be in the range from 30 μm to 500 μm, more preferably in the range from 50 μm to 400 μm, or most preferably in the range from 100 μm to 350 μm. The fine metal lines may include portions where the line width is greater than 200 μm for the purpose of making ground connections.

In terms of visible light transmittance, the aperture ratio of the first electroconductive film 16A and the second electroconductive film 16B according to the present embodiment should preferably be 85% or greater, more preferably 90% or greater, or most preferably 95% or greater. The aperture ratio refers to the ratio of the light-permeable areas, except the fine metal lines, to the overall film. For example, the aperture ratio of a square grid of thin metal lines having a line width of 6 μm and a fine line pitch of 240 μm is 95%.

Figure 12:
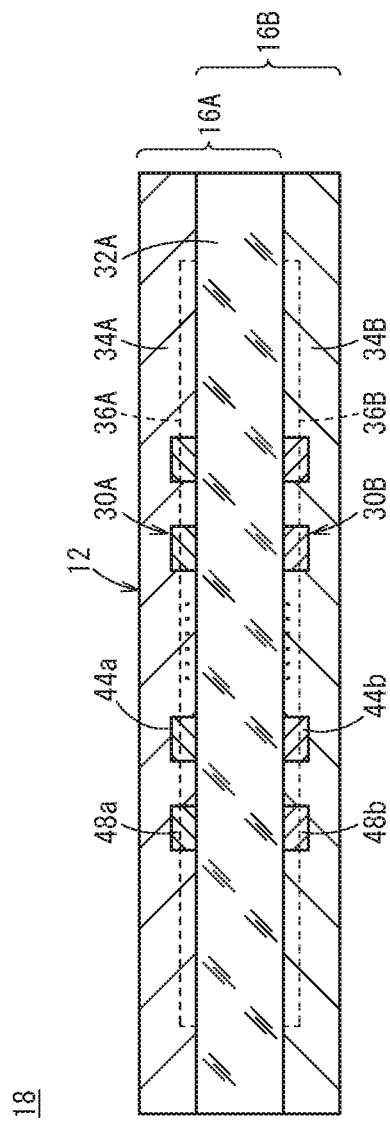
FIG. 12 is a view illustrating another example of a cross-sectional structure of a laminated electroconductive film.

In the laminated electroconductive film assembly 18, as shown in FIG. 2, for example, the first electroconductive section 30A is formed on the surface of the first transparent base 32A, and the second electroconductive section 30B is formed on the surface of the second transparent base 32B. According to another example, as shown in FIG. 12, the first electroconductive section 30A may be formed on the surface of the first transparent base 32A, and the second electroconductive section 30B may be disposed on the reverse side of the first transparent base 32A. In this case, the second transparent base 32B is dispensed with, and the first transparent base 32A is stacked on the second electroconductive section 30B whereas the first electroconductive section 30A is stacked on the first transparent base 32A. The first transparent adhesive layer 34A is formed in covering relation to the first electroconductive section 30A, and the second transparent adhesive layer 34B is disposed in covering relation to the second electroconductive section 30B. Another layer may be interposed between the first electroconductive film 16A and the second electroconductive film 16B, and the first electrodes 36A and the second electrodes 36B may be disposed in facing relation to each other provided they are insulated from each other.

As shown in FIG. 1, first alignment marks 66a and second alignment marks 66b for positioning the first electroconductive film 16A and the second electroconductive film 16B at the time they are to be bonded to each other should preferably be disposed on respective corners, for example, of the first electroconductive film 16A and the second electroconductive film 16B. The first alignment marks 66a and the second alignment marks 66b serve as new composite alignment marks after the first electroconductive film 16A and the second electroconductive film 16B are bonded into the laminated electroconductive film assembly 18. The composite alignment marks also function as alignment marks for positioning the laminated electroconductive film assembly 18 in a case where it is to be placed on the display panel 24.

In the above example, the first electroconductive film 16A and the second electroconductive film 16B are applied to the touch screen panel 10 of the projection-type electrostatic capacitance type. However, they may be applied to a touch screen panel of the surface-type electrostatic capacitance type and a touch screen panel of the resistance film type.

The first electroconductive film 16A and the second electroconductive film 16B according to the present embodiment may be used as an electroconductive film for the touch screen panel of the display device 22, an electromagnetic wave shield film of the display device 22, or an optical film on the display panel 24 of the display device 22. The display device 22 may be a liquid crystal display, a plasma display, an organic EL display, an inorganic EL display, or the like.

Methods of manufacturing the first electroconductive film 16A as a representative example will be described below. According to a method for manufacturing the first electroconductive film 16A, a photosensitive material having an emulsion layer containing a photosensitive silver halide salt as the first transparent base 32A, for example, is exposed to light and developed. Exposed areas and unexposed areas are made into metal silver areas and light-permeable areas, thereby producing the first electroconductive section 30A. Furthermore, the metal silver areas may additionally be physically developed or plated, or physically developed and plated, so that an electroconductive metal may be carried in the metal silver areas. An overall layer wherein the electroconductive metal is carried in the metal silver areas will be referred to as an electroconductive metal area.

Alternatively, a photosensitive plated layer is formed on the first transparent base 32A using a plating pretreatment material, after which it is exposed to light, developed, and then plated. Exposed areas and unexposed areas are made into metal areas and light-permeable areas, thereby producing a first electroconductive section 30A. Furthermore, the metal areas may additionally be physically developed or plated, or physically developed and plated so that an electroconductive metal may be carried in the metal areas.

Preferred forms of the method using the plating pretreatment material should preferably include the following two forms: Specific details of the forms described below are disclosed in Japanese Laid-Open Patent Publication No. 2003-213437, Japanese Laid-Open Patent Publication No. 2006-064923, Japanese Laid-Open Patent Publication No. 2006-058797, and Japanese Laid-Open Patent Publication No. 2006-135271, etc.

(a) A first transparent base 32A is coated with a plated layer containing a functional group that will interact with a plating catalyst or a precursor thereof. Thereafter, the plated layer is exposed to light, developed, and then plated to form a metal portion on the plated material.

(b) A foundation layer containing a polymer and a metal oxide and a plated layer containing a functional group that will interact with a plating catalyst or a precursor thereof are deposited in the order described on a first transparent base 32A. Thereafter, the plated layer is exposed to light, developed, and then plated to form a metal portion on the plated material.

According to another method, a photoresist film on a copper foil on a first transparent base 32A is exposed to light and developed into a resist pattern. A copper foil unmasked by the resist pattern is etched into a first electroconductive section 30A.

Alternatively, a paste containing file metal particles may be printed on a first transparent base 32A, and then, the paste may be plated with a metal, forming a first electroconductive section 30A.

Alternatively, a first electroconductive section 30A may be printed on a first transparent base 32A with a screen printing plate or a gravure printing plate.

Alternatively, a first electroconductive section 30A may be formed on a first transparent base 32A by an ink jet.

The makeup of each of the layers of the first electroconductive film 16A and the second electroconductive film 16B will be described in detail below.

[Transparent Base]

The first transparent base 32A and the second transparent base 32B may comprise a plastic film, a plastic plate, a glass plate, or the like. The plastic film and the plastic plate may be made of a polyester such as polyethylene terephthalate (PET), polyethylene naphthalate (PEN), or the like, or triacetyl cellulose (TAC) or the like. A plastic film or a plastic plate whose melting point is equal to or lower than approximately 290° C. or lower is preferable for use as the first transparent base 32A and the second transparent base 32B. Particularly, PET is preferable from the standpoint of light permeability, processability, etc.

[Silver Salt Emulsion Layer]

The silver salt emulsion layer to be made into the metal thin lines of the transparent electroconductive layer contains additives such as a solvent, a dye, etc. other than a silver salt and a binder.

The silver salt used according to the present embodiment includes an inorganic silver salt such as a silver halide or the like and an organic silver salt such as silver acetate or the like. According to the present embodiment, it is preferable to use a silver halide having excellent properties for use as an optical sensor.

The amount of coated silver (the amount of coated silver salt) of the silver salt emulsion layer should preferably be in the range from 1-30 $g/m^2$ in terms of silver, more preferably be in the range from 1-25 $g/m^2$, and much more preferably be in the range from 5-20 $g/m^2$. The amount of coated silver in the above range allows the electroconductive film to achieve a desired surface resistance.

The binder used according to the present embodiment includes, for example, gelatin, polyvinyl alcohol (PVA), polyvinylpyrrolidone (PVP), polysaccharide such as starch or the like, cellulose or its derivative, polyethylene oxide, polyvinyl amine, chitosan, polylysine, polyacrylic acid, polyalginic acid, polyhyaluronic acid, carboxy cellulose, or the like. These materials have neutral, anionic, and cationic properties due to the ionicity of the functional group.

The amount of the binder contained in the silver salt emulsion layer according to the present embodiment is not limited to any particular value, but may be appropriately determined within a range capable of exhibiting diffusing and adhering capabilities. The amount of the binder contained in the silver salt emulsion layer should preferably be equal to or larger than 1/4 in terms of a silver/binder volume ratio, and more preferably be equal to or more than 1/2. The silver/binder volume ratio should preferably be equal to or less than 100/1, and more preferably be equal to or less than 50/1. The silver/binder volume ratio should further preferably be in the range of 1/1-4/1, and most preferably be in the range of 1/1-3/1. The silver/binder volume ratio in the silver salt emulsion layer in the above ranges can suppress variations in the resistance value even on condition that the amount of coated silver is adjusted. As a result, it is possible to obtain an electroconductive film having a uniform surface resistance. The silver/binder volume ratio can be determined by converting the amount of silver halide/the amount of binder (weight ratio) of the raw material into the amount of silver/the amount of binder (weight ratio), and converting the amount of silver/the amount of binder (weight ratio) into the amount of silver/the amount of binder (volume ratio).

<Solvent>

The solvent used to form the silver salt emulsion layer is not limited to any particular materials, but may be water, an organic solvent (e.g., an alcohol such as methanol or the like, a ketone such as acetone or the like, an amide such as formamide or the like, a sulfoxide such as dimethyl sulfoxide or the like, an ester such as ethyl acetate or the like, or an ether), an ionic liquid, or a solvent as a mixture of these materials.

<Other Additives>

Various additives used according to the present embodiment are not limited to any particular materials. Publicly known additives may preferably be used.

[Other Layer Structures]

A protective layer, not shown, may be provided on the silver salt emulsion layer, and an undercoat layer, for example, may be provided beneath the silver salt emulsion layer.

[Electroconductive Films]

The thickness of the first transparent base 32A of the first electroconductive film 16A and the second transparent base 32B of the second electroconductive film 16B should preferably be in the range from 5 to 350 µm and more preferably be in the range from 30 to 150 µm. The thickness in the range from 5 to 350 µm allows the electroconductive films to have a desired permeability to visible light and to be handled with ease.

The thickness of the metal silver areas on the first transparent base 32A and the second transparent base 32B can appropriately be determined depending on the coated thickness of a paint for the silver salt emulsion layers on the first transparent base 32A and the second transparent base 32B. Though a value in the range of 0.001 µm to 0.2 mm can be selected for the thickness of the metal silver areas, the thickness of the metal silver areas should preferably be equal to or less than 30 µm, more preferably be equal to or less than 20 µm, much more preferably be in the range of 0.01-9 µm, and most preferably be in the range of 0.05-5 µm. The metal silver areas should preferably be shaped in a pattern. The metal silver areas may be in one layer or may be of a multi-layered structure including two or more layers. On condition that the metal silver areas are shaped in a pattern and of a multi-layered structure including two or more layers, then different color sensitivities can be given to the metal silver areas for making them sensitive to different wavelengths. The different color sensitivities that are given to the metal silver areas make it possible to form different patterns in the respective layers in a case where the metal silver areas are exposed to different exposure wavelengths.

The thickness of the electroconductive metal areas for use in the touch screen panel 10 should preferably be thinner as it gives a wider angle of view to the display panel 24. The electroconductive metal areas are also required to be thinner for an increased visibility. From these points of view, the thickness of the layer of the electroconductive metal carried by the electroconductive metal areas should preferably be less than 9 µm, more preferably be in the range from 0.1 µm to less than 5 µm, and much more preferably be in the range from 0.1 µm to less than 3 µm.

According to the present embodiment, metal silver areas having a desired thickness can be formed by controlling the coated thickness of the silver salt emulsion layer referred to above, and the thickness of the layer made up of electroconductive metal particles can freely be controlled by at least one of the physical development process and the plating process. Therefore, an electroconductive film whose thickness is less than 5 µm or preferably less than 3 µm can easily be formed.

The method of manufacturing the first electroconductive film 16A and the second electroconductive film 16B may not necessarily include steps such as a plating step because the desired surface resistance can be obtained by adjusting the coated amount of silver in the silver salt emulsion layer and the silver/binder volume ratio. As necessary, a calendering process, etc. may be carried out.

The present invention can appropriately be combined with the technologies disclosed in Japanese Laid-Open Patent Publications and WO Pamphlets listed in Table 1 and Table 2 below, where the terms "Japanese Laid-Open Patent Publications", "Publications", and "Pamphlets" are omitted.

TABLE 1

| | | | | |
|---|---|---|---|---|
| 2004-221564 | 2004-221565 | 2007-200922 | 2006-352073 | 2006-228469 |
| 2007-235115 | 2007-207987 | 2006-012935 | 2006-010795 | 2007-072171 |
| 2006-332459 | 2009-21153 | 2007-226215 | 2006-261315 | 2006-324203 |
| 2007-102200 | 2006-228473 | 2006-269795 | 2006-336090 | 2006-336099 |
| 2006-228478 | 2006-228836 | 2007-009326 | 2007-201378 | 2007-335729 |
| 2006-348351 | 2007-270321 | 2007-270322 | 2007-178915 | 2007-334325 |
| 2007-134439 | 2007-149760 | 2007-208133 | 2007-207883 | 2007-013130 |
| 2007-310091 | 2007-116137 | 2007-088219 | 2008-227351 | 2008-244067 |
| 2005-302508 | 2008-218784 | 2008-227350 | 2008-277676 | 2008-282840 |
| 2008-267814 | 2008-270405 | 2008-277675 | 2008-300720 | 2008-300721 |
| 2008-283029 | 2008-288305 | 2008-288419 | 2009-21334 | 2009-26933 |
| 2009-4213 | 2009-10001 | 2009-16526 | 2008-171568 | 2008-198388 |
| 2008-147507 | 2008-159770 | 2008-159771 | 2008-235224 | 2008-235467 |
| 2008-218096 | 2008-218264 | 2008-224916 | 2008-252046 | 2008-277428 |
| 2008-241987 | 2008-251274 | 2008-251275 | 2007-129205 | |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

The wiring board according to the present invention is not limited to the above embodiments, but may adopt various arrangements without departing from the scope of the invention.

The invention claimed is:

1. A wiring board including an insulating board and an electroconductive section disposed on a surface of the insulating board, wherein the electroconductive section comprises:
a plurality of electrodes disposed on the surface of the insulating board;
a plurality of terminals disposed on the surface of the insulating board in corresponding relation to the electrodes, for electric connection to an external circuit; and
terminal interconnects disposed on the surface of the insulating board and configured to electrically connect the electrodes respectively to the terminals corresponding thereto, said terminal interconnects are made of a single material;
a line width of a portion of each of the terminal interconnects which lies within a circle having a radius of 10 mm about a boundary between the terminal interconnect and the corresponding one of the terminals is configured to be 5 µm or greater and 100 µm or smaller; and
an interconnect resistance value of each of the terminal interconnects is configured to be 100 ohms or greater and 10 kohms or smaller, wherein the plurality of electrodes are disposed as a transparent electroconductive layer on the surface of the insulating board;
the plurality of terminals are disposed on the surface of the insulating board in corresponding relation to the electrodes, for electric connection to an external circuit;
the terminal interconnects are disposed on the surface of the insulating board and configured to electrically connect the electrodes respectively to the terminals corresponding thereto; and
the electroconductive section has a same thickness in the electrodes, the terminals, and the terminal interconnects.

2. The wiring board according to claim 1, wherein the line width of the portion of each of the terminal interconnects which lies within the circle having the radius of 10 mm about the boundary between the terminal interconnect and the corresponding one of the terminals is configured to be 10 µm or greater and 50 µm or smaller.

3. The wiring board according to claim 1, wherein the interconnect resistance value of each of the terminal interconnects is configured to be 200 ohms or greater and 5 kohms or smaller.

4. The wiring board according to claim 1, wherein the terminal interconnect connected to one or more of the terminals whose linear distance up to the corresponding electrode is shortest, includes a portion which lies within the circle having a radius of 10 mm about a boundary between the terminal interconnect and the corresponding terminal, and the portion is configured to extend tortuously longer than the linear distance.

5. The wiring board according to claim 1, wherein the terminal interconnect connected to one or more of the terminals whose linear distance up to the corresponding electrode is shortest, includes a portion which lies within the circle having a radius of 10 mm about a boundary between the terminal interconnect and the corresponding terminal, and the portion includes at least one bend.

6. The wiring board according to claim 5, wherein the portion has a pattern in which the bend is repeated at least once; and
the pattern has an interval which is at least twice greater than the line width of the pattern.

7. The wiring board according to claim 1, wherein an electrode film which is kept at a constant potential is formed on a reverse side of the insulating board in a portion thereof which is close to the terminals and is configured to face a portion of each of the terminal interconnects.

8. The wiring board according to claim 1, wherein the electroconductive section is configured to be made of a single electroconductive material, and the single electroconductive material comprises a metal which is one of silver, copper, and aluminum, or an alloy containing at least one of silver, copper, and aluminum.

9. The wiring board according to claim 1, wherein the electroconductive section has an electroconductivity in a range of $1 \times 10^6$ to $5 \times 10^6$ S/m.

* * * * *